(12) United States Patent
Hanya et al.

(10) Patent No.: US 8,094,416 B2
(45) Date of Patent: Jan. 10, 2012

(54) HEAD SUSPENSION AND PIEZOELECTRIC ACTUATOR

(75) Inventors: Masao Hanya, Aikoh-gun (JP); Toshiki Ando, Aikoh-gun (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 625 days.

(21) Appl. No.: 12/284,669

(22) Filed: Sep. 24, 2008

(65) Prior Publication Data

US 2009/0086379 A1 Apr. 2, 2009

(30) Foreign Application Priority Data

Sep. 27, 2007 (JP) ................................ P2007-250954

(51) Int. Cl.
*G11B 21/10* (2006.01)

(52) U.S. Cl. ..................................... 360/294.4

(58) Field of Classification Search ........................ None
See application file for complete search history.

(56) References Cited

U.S. PATENT DOCUMENTS

| | | | |
|---|---|---|---|
| 6,597,541 B2 * | 7/2003 | Nishida et al. ............. | 360/294.4 |
| 6,661,618 B2 | 12/2003 | Fujiwara et al. | |
| 6,661,619 B2 | 12/2003 | Nishida et al. | |
| 6,680,826 B2 * | 1/2004 | Shiraishi et al. ........... | 360/294.4 |
| 6,731,472 B2 | 5/2004 | Okamoto et al. | |
| 6,741,012 B2 | 5/2004 | Koganezawa et al. | |
| 6,760,194 B2 * | 7/2004 | Shiraishi et al. ........... | 360/244.2 |
| 7,061,724 B2 | 6/2006 | Koganezawa | |
| 7,167,344 B2 | 1/2007 | Nakagawa et al. | |
| 7,215,068 B2 | 5/2007 | Koganezawa et al. | |
| 2001/0055182 A1 * | 12/2001 | Wu et al. ..................... | 360/294.4 |
| 2002/0075606 A1 * | 6/2002 | Nishida et al. ............. | 360/294.4 |
| 2003/0123196 A1 * | 7/2003 | Shiraishi et al. ........... | 360/294.4 |
| 2004/0095686 A1 * | 5/2004 | Kuwajima et al. ......... | 360/294.4 |
| 2004/0100736 A1 * | 5/2004 | Kuwajima et al. ......... | 360/294.4 |
| 2005/0047024 A1 | 3/2005 | Yamazaki et al. | |

FOREIGN PATENT DOCUMENTS

| | | |
|---|---|---|
| JP | 10-293979 | 11/1998 |
| JP | 2001-178162 | 6/2001 |
| JP | 2001-307443 | 11/2001 |
| JP | 2001-339967 | 12/2001 |
| JP | 2002-050140 | 2/2002 |
| JP | 2002-184139 | 6/2002 |
| JP | 2002-184140 | 6/2002 |
| JP | 2002-197819 | 7/2002 |
| JP | 2002-208124 | 7/2002 |
| JP | 2002-367306 | 12/2002 |

(Continued)

*Primary Examiner* — Mark Blouin

(74) *Attorney, Agent, or Firm* — Jordan and Hamburg LLP

(57) ABSTRACT

A head suspension with a piezoelectric element involves simple wiring and realizes high reliability, the head suspension has a base plate, a load beam connected to the base plate, a flexure attached to the load beam, and a piezoelectric actuator having a piezoelectric element arranged between the base plate and the load beam, the piezoelectric element is configured to deform according to a state of applied voltage and move a front end of the load beam in a sway direction according to the deformation, and the piezoelectric element has first and second piezoelectric parts that are oppositely polarized and deform according to a state of applied voltage, a common electrode formed over first surfaces of the first and second piezoelectric parts, a first electrode formed on a second surface of the first piezoelectric part, and a second electrode formed on a second surface of the second piezoelectric part.

12 Claims, 7 Drawing Sheets

FOREIGN PATENT DOCUMENTS

| | | |
|---|---|---|
| JP | 2002-373475 | 12/2002 |
| JP | 2003-061371 | 2/2003 |
| JP | 2003-228928 | 8/2003 |
| JP | 2005-078753 | 3/2005 |
| JP | 2005-228420 | 8/2005 |
| JP | 2005-312200 | 11/2005 |

* cited by examiner

HEAD SUSPENSION AND PIEZOELECTRIC ACTUATOR

BACKGROUND OF THE INVENTION

1. Field of the Invention

The present invention relates to a head suspension incorporating a piezoelectric actuator that deforms in response to the state of an applied voltage and drives an object according to the deformation. In particular, the present invention relates to a head suspension and a piezoelectric actuator that are reliable and easy to wire.

2. Description of Related Art

Recent information devices are miniaturized and elaborated to necessitate micro-actuators capable of conducting precise positioning. Such precision micro-actuators are particularly needed by optical systems for controlling focal points and inclinations, inkjet printers, and magnetic disk units.

The magnetic disk units are expanding a market and are being expected to improve their performance and storage capacities. Generally, the storage capacity of a magnetic disk unit expands if the storage capacity of a magnetic disk adopted for the magnetic disk unit increases. Increasing the recording density of a magnetic disk without changing the diameter of the disk is achievable by increasing the number of tracks per inch, i.e., by narrowing each track on the disk. To handle such a narrow track, the magnetic disk unit must precisely control the position of a head in a track width direction. Namely, there is a need of an actuator capable of accurately conducting a positioning operation in a very small range.

The magnetic disk unit or a hard disk drive (HDD) includes a magnetic disk and employs a magnetic head to write and read data to and from the magnetic disk. The magnetic head includes a slider that faces a recording surface of the magnetic disk and a transducer incorporated in the slider. When the disk is turned at high speed, the slider slightly floats from the disk to form an air bearing between the disk and the slider.

The magnetic head is supported with a head suspension. The head suspension includes a load beam, a base plate attached to the load beam, and the like. A front end of the load beam supports a flexure made of a thin plate spring. A front end of the flexure holds the slider of the magnetic head.

The hard disk drive must trace the center of a track on the disk at an error of ±10% or lower with respect to the width of the track. Recent high-density disks have a track width of 0.13 μm or narrower to increase the difficulty of tracing the center of the track with the slider. To realize an accurate tracking operation, the disk must be rigid to suppress vibration and the slider must precisely be positioned.

The hard disk drive generally employs a single actuator system that drives a head suspension with a voice coil motor alone. The hard disk drive involves many resonant peaks in a low frequency band. Due to this, it is difficult for the single voice coil motor to drive the slider (head) attached to a front end of the head suspension at high frequencies. Namely, it is difficult for the single actuator system to increase a servo band width.

To cope with this problem, a head suspension employing a dual actuator system has been developed. The dual actuator system employs, in addition to a voice coil motor, a piezoelectric element made of PZT (piezoelectric zirconate titanate) serving as a precision positioning actuator. The piezoelectric element of the dual actuator system minutely drives a front end of the head suspension or the slider in a width direction (sway direction). The dual actuator system usually employs a pair of piezoelectric elements arranged side by side in the width direction, to smoothly drive a driving object, i.e., the slider. The driving object to be driven by the piezoelectric elements of the dual actuator system is light compared with the driving object of the single actuator system, and therefore, the dual actuator system can carry out positioning control at higher frequencies. Unlike the single actuator system, the dual actuator system can maintain a wide servo band width for controlling the position of the slider, to thereby reduce tracking errors.

The applicant of the present invention has proposed in Japanese Unexamined Patent Application Publication No. 2002-050140 a head suspension employing the dual actuator system. This head suspension employs a pair of piezoelectric elements and includes a base plate, a connection plate having a hinge thinner than the base plate, a load beam, and a flexure attached to the load beam. The piezoelectric elements are made of PZT. This head suspension is capable of increasing resonant frequencies. Another head suspension is disclosed in Japanese Unexamined Patent Application Publication No. 2005-312200. This head suspension includes a piezoelectric actuator consisting of a pair of piezoelectric elements. A stationary electrode is arranged on a base of the piezoelectric actuator and is composed of a conductive layer and an interconnecting conductive layer that are formed on an insulating layer. The piezoelectric elements are adhered to the conductive layer. The stationary electrode includes a stainless steel layer, the insulating layer, and the conductive layer.

Each of these related arts arranges a pair of piezoelectric elements for a head suspension. The two piezoelectric elements need four electrodes that need four systems of electrical connection. Namely, each related art must prepare many systems of electrical connection to complicate wiring and deteriorate reliability.

SUMMARY OF THE INVENTION

An object of the present invention is to provide a head suspension with a piezoelectric actuator, capable of simplifying wiring and improving reliability.

In order to accomplish the object, an aspect of the present invention provides a head suspension having a base plate, a load beam connected to the base plate, and a flexure attached to the load beam. The head suspension includes a piezoelectric actuator having a piezoelectric element arranged between the base plate and the load beam. The piezoelectric element is configured to deform according to a state of applied voltage and move a front end of the load beam in a sway direction according to the deformation. The piezoelectric element includes first and second piezoelectric parts that are oppositely polarized and deform according to a state of applied voltage, a common electrode formed over first surfaces of the first and second piezoelectric parts, a first electrode formed on a second surface of the first piezoelectric part, and a second electrode formed on a second surface of the second piezoelectric part.

According to this aspect of the present invention, the common electrode is formed over the first surfaces of the first and second piezoelectric parts, the first electrode is formed on the second surface of the first piezoelectric part, and the second electrode is formed on the second surface of the second piezoelectric part. This configuration reduces the number of wiring systems, simplifies wiring, improves reliability, reduces the number of parts, enables easy management of parts, and decreases costs.

DETAILED DESCRIPTION OF EMBODIMENTS

Head suspensions and piezoelectric actuators according to embodiments of the present invention will be explained in detail with reference to the drawings.

A piezoelectric actuator according to First embodiment of the present invention will be explained. The piezoelectric actuator is incorporated in a head suspension.

Figure 1:
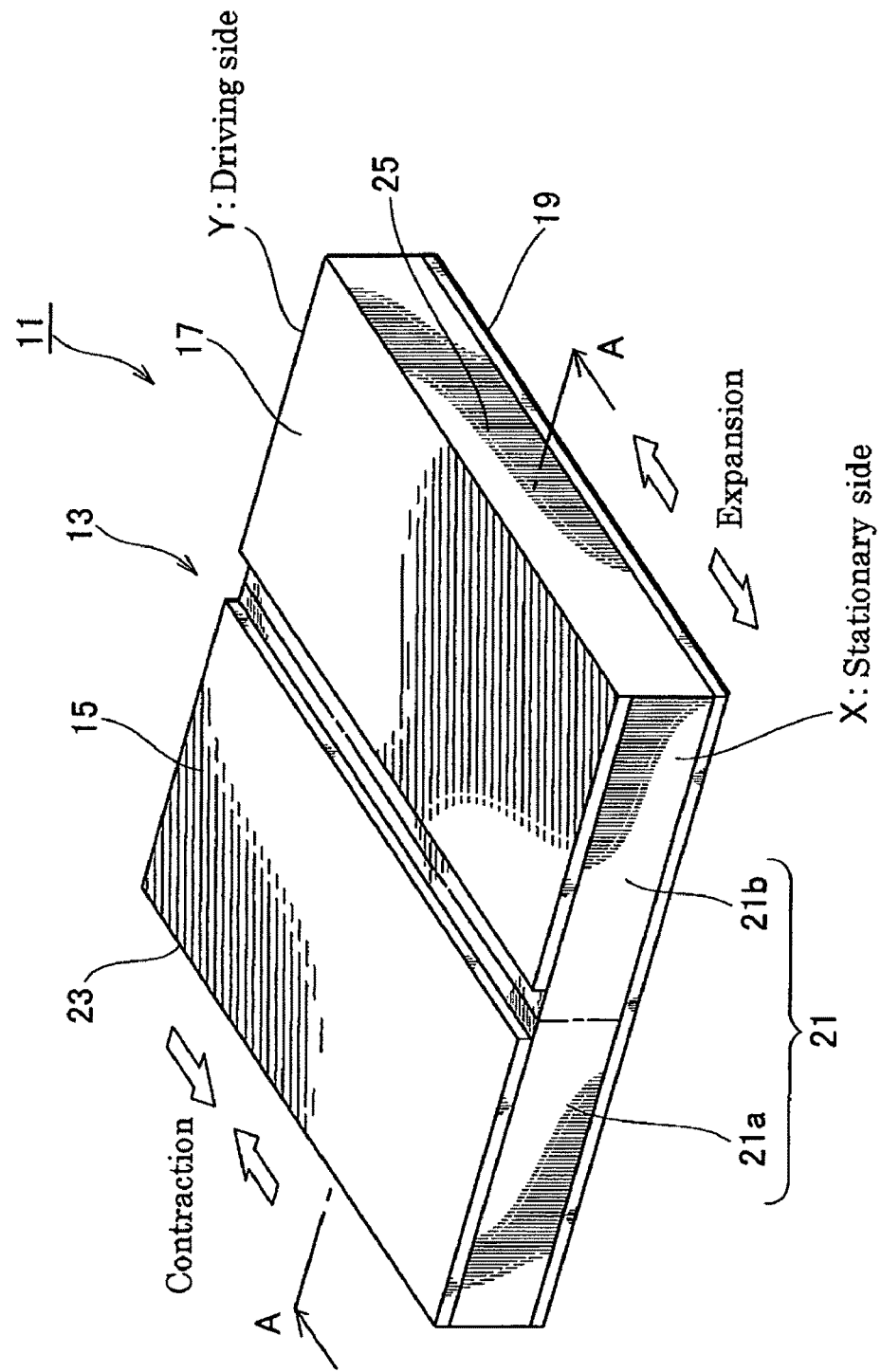
FIG. 1 is a perspective view showing a piezoelectric actuator according to a first embodiment of the present invention.
Figure 2:
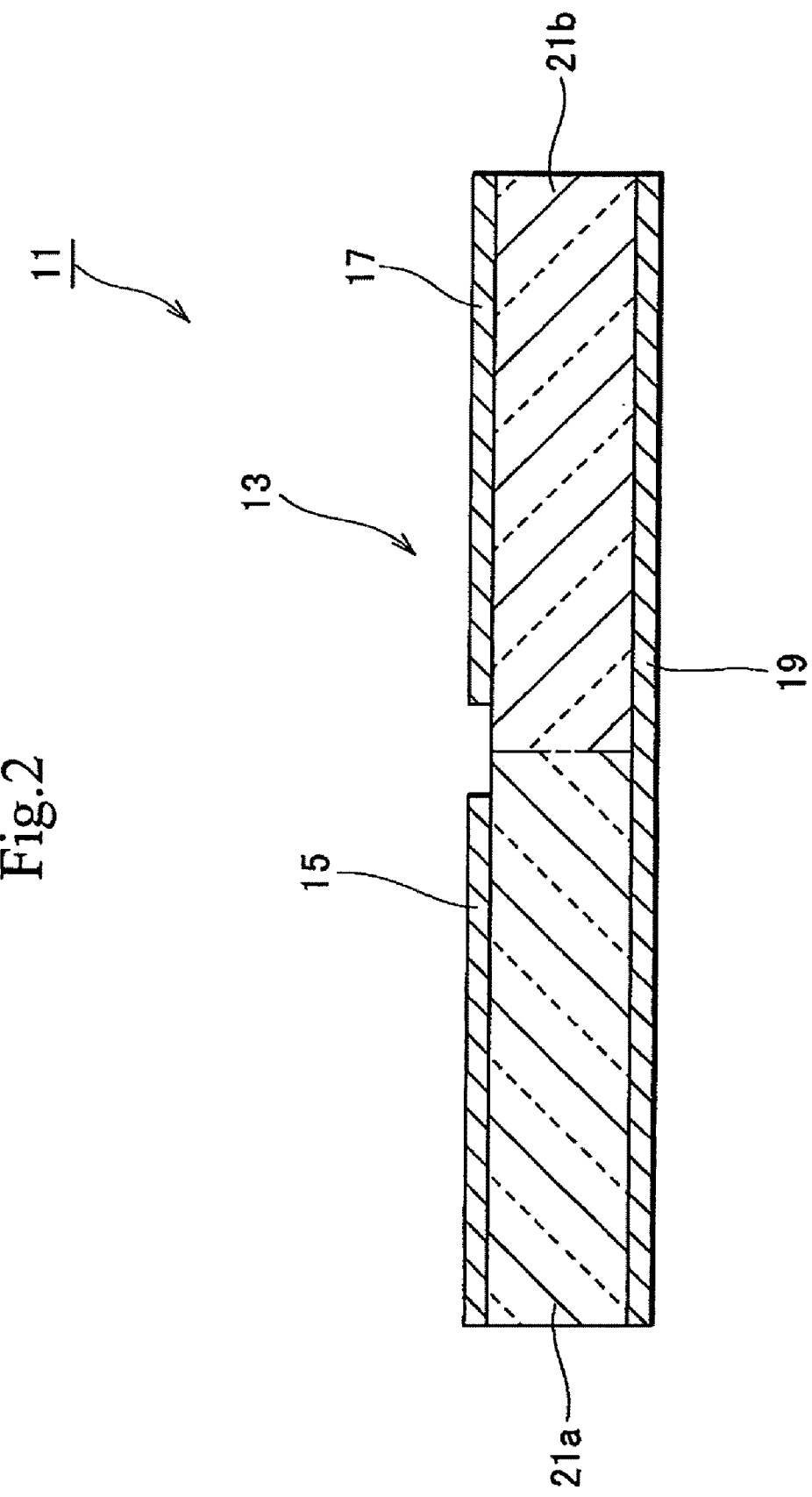
FIG. 2 is a sectional view taken along a line A-A of FIG. 1.

FIG. 1 is a perspective view showing the piezoelectric actuator 11 according to a first embodiment of the present invention and FIG. 2 is a sectional view taken along a line A-A of FIG. 1.

The piezoelectric actuator 11 is deformable according to a state of applied voltage to a piezoelectric element 13, to drive a driving object such as a load beam 35 according to the deformation. "Deformable according to a state of applied voltage" implicates a deformation to occur according to the application/stoppage of a voltage and a deformation to occur depending on the level of an applied voltage.

The piezoelectric element 13 of the piezoelectric actuator 11 substantially has a rectangular shape and includes a piezoelectric material 21, a common electrode 19, and a pair of first and second electrodes 15 and 17. The electrodes 15, 17, and 19 each have a plate-like shape.

The piezoelectric material 21 includes first and second piezoelectric parts 21a and 21b that deform according to a state of applied voltage. The piezoelectric parts 21a and 21b are arranged side by side and are oppositely polarized. The piezoelectric parts 21a and 21b are made of, for example, piezoelectric ceramics and are polarized so that their polarities differ from each other by 180 degrees. The piezoelectric parts 21a and 21b receive voltage through the first and second electrodes 15 and 17, respectively. Namely, the piezoelectric parts 21a and 21b deform according the states of applied voltage to the electrodes 15 and 17.

The first electrode 15 is formed on a second surface of the first piezoelectric part 21a and the second electrode 17 is formed on a second surface of the second piezoelectric part 21b. There is a gap between the electrodes 15 and 17. Namely, the electrodes 15 and 17 are in a common plane and are spaced from each other by the gap of a predetermined distance. The electrodes 15 and 17 substantially have the same shape and size.

The common electrode 19 is formed over first surfaces of the first and second piezoelectric parts 21a and 21b. According to the first embodiment, the common electrode 19 entirely covers the first surfaces of the piezoelectric parts 21a and 21b that are arranged adjacent to each other. The common electrode 19 solidly holds the piezoelectric parts 21a and 21b.

The common electrode 19 opposes the first and second electrodes 15 and 17 with the piezoelectric material 21 interposed between them. The shape and size of the common electrode 19 are substantially equal to the collective shape and size of the electrodes 15 and 17 and gap between them.

The electrodes 15 and 17 and common electrode 19 may be made of low-contact-resistance metal such as gold (Au).

Operation of the piezoelectric actuator 11 will be explained. A stationary side X and a driving side Y are defined as shown in FIG. 1 on the piezoelectric element 13 of the piezoelectric actuator 11. The first and second electrodes 15 and 17 are electrically grounded and a predetermined voltage is applied to the common electrode 19. In this case, an end face 23 of the piezoelectric element 13 under the first electrode 15 contracts and an end face 25 of the piezoelectric element 13 under the second electrode 17 elongates as shown in FIG. 1. As a result, the piezoelectric element 13 as a whole deforms substantially into a trapezoidal shape as if the piezoelectric element 13 turns by a small distance in a direction +Z (FIG. 1). Due to the deformation, the piezoelectric actuator 11 can move a driving object (not shown) attached to the driving side Y.

Contrary to the above, the common electrode 19 is electrically grounded and a predetermined voltage is applied to the first and second electrodes 15 and 17. Then, the piezoelectric element 13 turns by a small distance in a direction −Z that is opposite to the direction +Z, to displace the driving object attached to the driving side Y.

As explained above, the piezoelectric actuator 11 according to the first embodiment needs only three systems of electrical connection for the three electrodes, i.e., the first and second electrodes 15 and 17 and common electrode 19. According to the related art employing a pair of separate piezoelectric elements to form a piezoelectric actuator, four separate electrodes need four systems of electrical connection. Compared with this, the piezoelectric actuator 11 according to the first embodiment can simplify wiring and improve reliability.

Unlike the related art employing a pair of separate piezoelectric elements to form a piezoelectric actuator, the first embodiment employs a single piezoelectric element to reduce the number of parts, simplify parts management, and reduce costs.

For example, the related art must handle a pair of separate piezoelectric elements for a piezoelectric actuator, to involve a risk of mistaking the polarities of the piezoelectric elements. The first embodiment can eliminate such a risk.

A head suspension 31 according to a second embodiment of the present invention will be explained with reference to FIGS. 3 to 5. The head suspension 31 employs the piezoelectric actuator 11 of the first embodiment.

Figure 3:
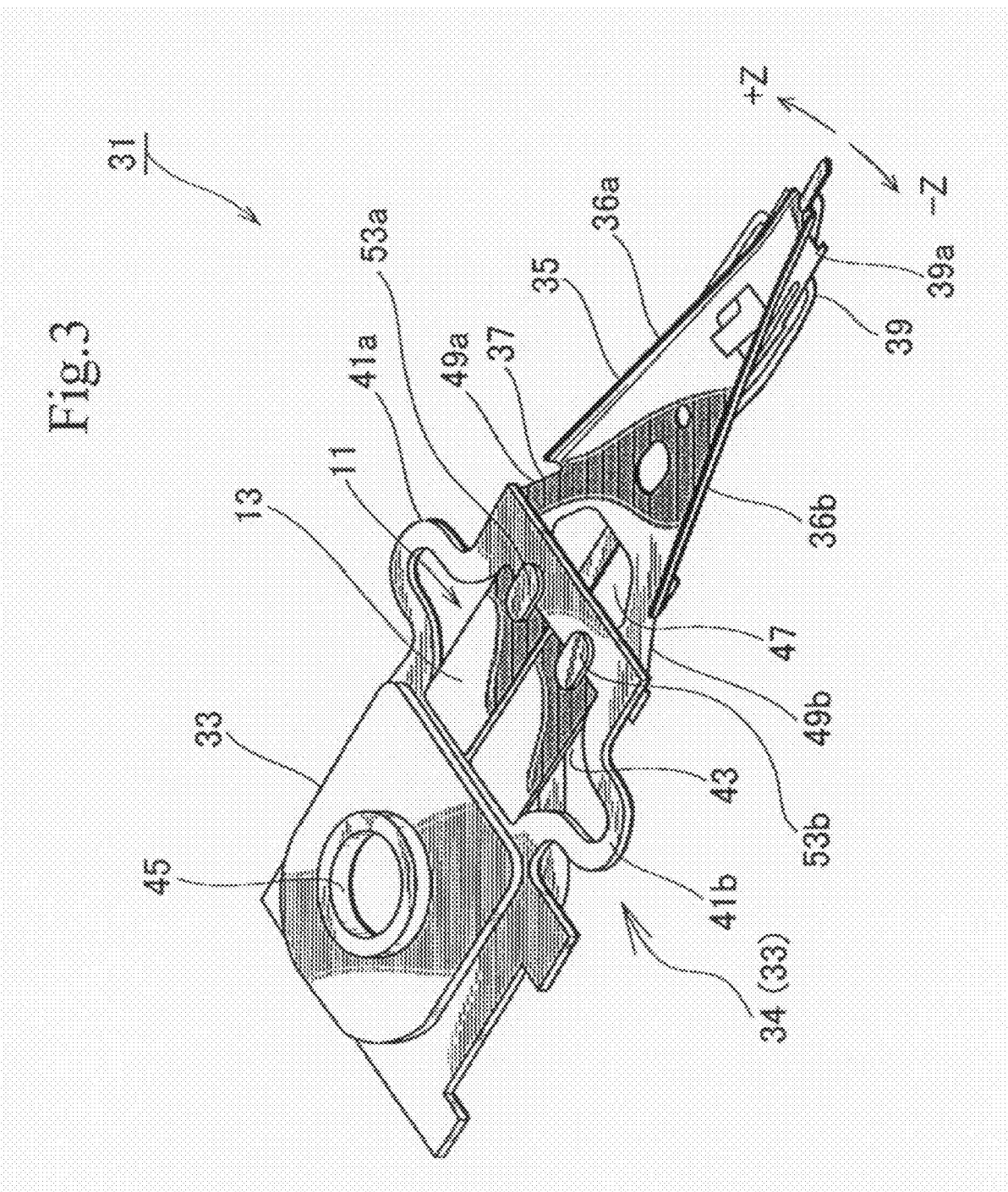
FIG. 3 is a perspective view showing a head suspension according to a second embodiment of the present invention.
Figure 4:
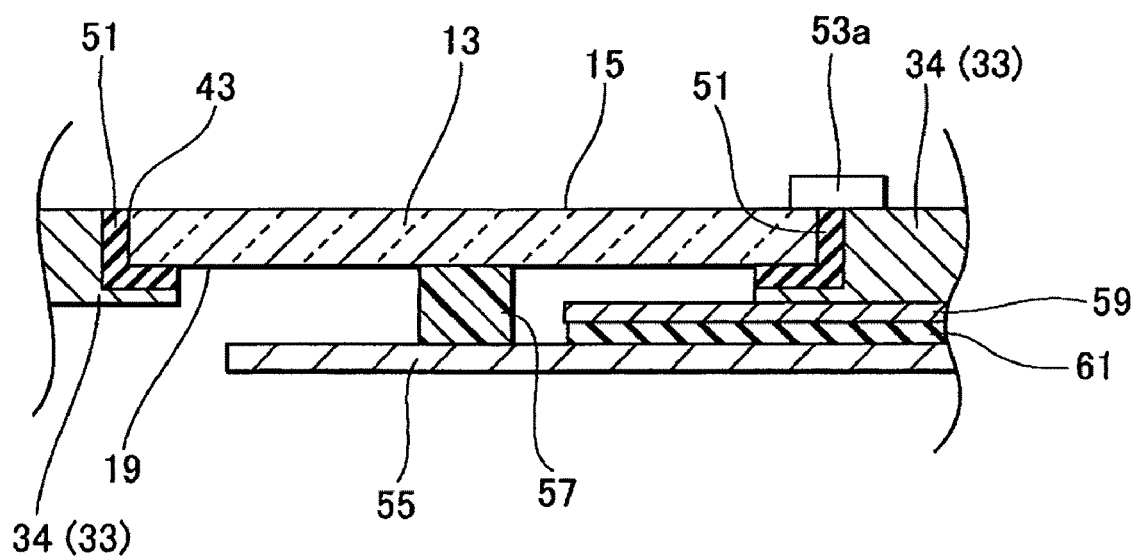
FIG. 4 is a sectional view partly showing a laminated state around an opening of the head suspension of FIG. 3.
Figure 5:
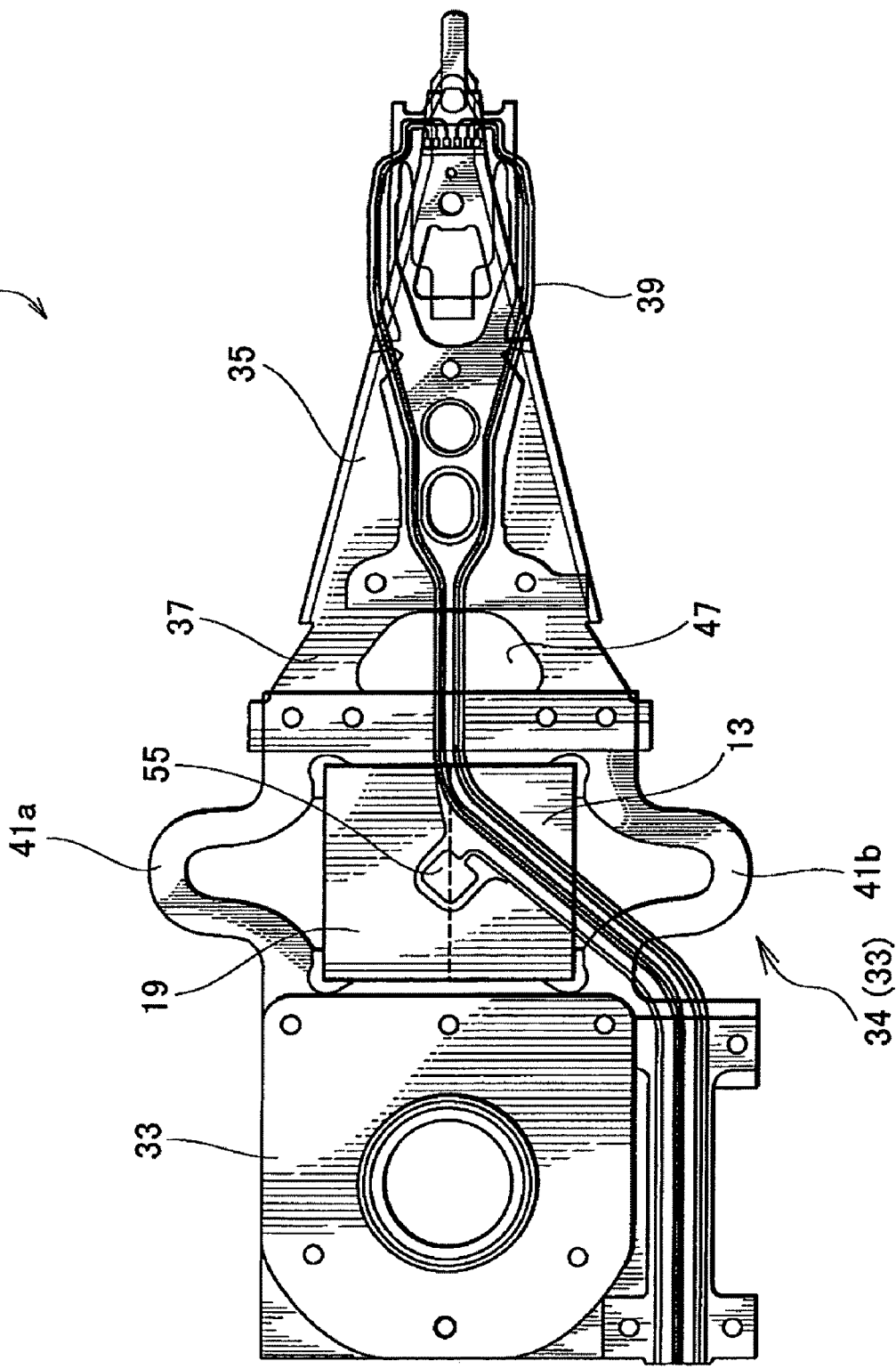
FIG. 5 is a plan view showing the bottom of the head suspension of FIG. 3.

FIG. 3 is a perspective view showing the head suspension 31 according to the second embodiment, FIG. 4 is a sectional view partly showing a laminated state around an opening of the head suspension 31, and FIG. 5 is a plan view showing the bottom of the head suspension 31.

The head suspension 31 includes a base plate 33, a load beam 35, a connection plate 37, the piezoelectric actuator 11, and the like. Depending on deformation of the piezoelectric actuator 11, a front end of the load beam 35 moves in a sway direction.

The base plate 33 has a thickness of, for example, about 150 to 200 μm and is made of metal such as stainless steel. The base plate 33 has a substantially circular boss 45 that is fixed to a front end of an arm (not shown). The arm is driven by a voice coil motor (not shown), to turn the base plate 33. The base plate 33 is integral with an actuator plate 34 to which the piezoelectric actuator 11 is attached. The actuator plate 34 has an opening 43 and flexible parts 41a and 41b.

The opening 43 is formed through the actuator plate 34, to receive the piezoelectric element 13. The details of this will be explained later.

The flexible parts 41a and 41b are formed on widthwise sides of the actuator plate 34. Each of the flexible parts 41a and 41b has an outwardly protruding U-shaped part that faces a side face of the piezoelectric element 13 placed in the opening 43.

The base plate 33 and actuator plate 34 may be made of light alloy such as aluminum alloy, or a clad material composed of light alloy and stainless steel. Such light material can reduce the inertia of the base plate 33, increase a resonant frequency in a sway direction, and improve the tracing ability of the head suspension 31.

Instead of integrating the base plate 33 with the actuator plate 34 having the flexible parts 41a and 41b and opening 43, the base plate 33 may be separated from the actuator plate 34. In this case, the base plate 33 is laid on a rear end of the actuator plate 34 and is fixed thereto by, for example, laser welding. It is possible to eliminate the actuator plate 34.

Namely, the head suspension according to the present invention may have the base plate 33 and actuator plate 34, or may have the base plate 33 without the actuator plate 34. According to the second embodiment, the head suspension 31 has the base plate 33 integrated with the actuator plate 34.

The load beam 35 has a flexure 39. A front end of the flexure 39 is provided with a slider 39a that forms a magnetic head. The load beam 35 is made of a stainless steel plate of, for example, about 30 to 150 μm thick to apply load onto the slider 39a of the flexure 39. The flexure 39 is made of a thin precision metal plate spring thinner than the load beam 35.

Sides of the load beam 35 form bent edges 36a and 36b to heighten the rigidity of the load beam 35. A rear end of the load beam 35 is integral with the connection plate 37. The load beam 35 may be made of light alloy such as aluminum alloy, or a clad material made of light alloy and stainless steel. Employing such light metal results in reducing the inertia of the load beam 35, increasing the resonant frequency thereof in a sway direction, and improving the tracing ability of the head suspension 31.

The connection plate 37 is made of a resilient metal plate of, for example, about 30 μm thick and functions as a hinge. The connection plate 37 has a hole 47 to reduce the bending rigidity of the connection plate 37 in thickness directions. On each side of the hole 47, there are hinges 49a and 49b bendable in the thickness directions. A rear end of the connection plate 37 is connected to the actuator plate 34 that is at a front end of the base plate 33. Namely, the rear end of the connection plate 37 is laid on the back of the front end of the actuator plate 34 and is fixed thereto by, for example, laser welding. As a result, the load beam 35 is connected to the base plate 33 so that, when the flexible parts 41a and 41b flex, the load beam 35 moves in a sway direction.

The piezoelectric element 13 is set in the opening 43 of the actuator plate 34 and is held therein as shown in FIGS. 3 and 4. The piezoelectric element 13 is secured at a predetermined position with an inner circumferential face of the opening 43 and is supported from the bottom thereof. At this time, the piezoelectric element 13 is surrounded by the actuator plate 34 and base plate 33.

In this state, the first and second electrodes 15 and 17 are on the upper side (opposite to the flexure 39) of the piezoelectric element 13 and the common electrode 19 is on the lower side (facing the flexure 39) thereof. As shown in FIG. 4, the common electrode 19 faces, through the opening 43, wiring 55 (made of, for example, copper) formed on the flexure 39. A part of the wiring 55 that faces the common electrode 19 is exposed by partly removing a metal substrate 59 and an electric insulating layer 61 from the flexure 39.

Between the piezoelectric element 13 and the opening 43 along front and rear edges of the opening 43, a nonconductive adhesive layer 51 of proper thickness is formed. To firmly hold the piezoelectric element 13, the front and rear edges of the opening 43 are partly etched.

The nonconductive adhesive layer 51 secures electric insulation between the common electrode 19 of the piezoelectric element 13 and the actuator plate 34 and effectively transmits a deformation (displacement) of the piezoelectric element 13 to the load beam 35. The part where the actuator plate 34 and connection plate 37 laid on each other serves as the driving side Y of the piezoelectric actuator 11.

As shown in FIGS. 4 and 5, there is a gap between the common electrode 19 of the piezoelectric element 13 and the wiring 55 of the flexure 39, and in the gap, a conductive adhesive layer 57 is formed to establish electrical connection between the common electrode 19 and the wiring 55. Instead of the conductive adhesive layer 57, wire bonding, soldering, ultrasonic joining, or the like may be employed to connect the common electrode 19 and wiring 55 to each other.

Between the first and second electrodes 15 and 17 of the piezoelectric element 13 and the actuator plate 34 on the side opposite to the flexure 39, conductive adhesives 53a and 53b are applied to secure electrical connection.

Operation of the head suspension 31 will be explained. The first and second electrodes 15 and 17 are electrically grounded and a predetermined voltage is applied to the common electrode 19. In this case, the end face 23 of the piezoelectric element 13 under the first electrode 15 contracts and the end face 25 of the piezoelectric element 13 under the second electrode 17 extends as shown in FIG. 1. As a result, the piezoelectric element 13 as a whole deforms substantially into a trapezoidal shape as if it turns in a direction +Z (FIG. 3) by a small distance. Namely, the piezoelectric actuator 11 moves the moving object, i.e., the load beam 35 in the sway direction +Z.

Contrary to the above, the common electrode 19 is electrically grounded and a predetermined voltage is applied to the first and second electrodes 15 and 17. In this case, the piezoelectric element 13 deforms in a direction −Z (FIG. 3) by a small distance, to move the load beam 35 in the sway direction −Z.

The head suspension 31 according to the second embodiment incorporating the piezoelectric actuator 11 is required to secure three systems of electrical connection for the three electrodes, i.e., the first and second electrodes 15 and 17 and common electrode 19 of the piezoelectric element 13. Compared with the head suspension of the related art that must secure four systems of electrical connection, the head suspension 31 of the second embodiment can simplify wiring and improve reliability.

According to the second embodiment, the single piezoelectric element 13 is held in the opening 43 of the actuator plate 34. This improves the efficacy of assembling work.

In the opening 43, the piezoelectric element 13 is supported from the bottom thereof and is surrounded by the actuator plate 34 and base plate 33. This configuration easily positions the piezoelectric element 13 without damaging the piezoelectric element 13 that is brittle.

The common electrode 19 faces the wiring 55 of the flexure 39, and therefore, can easily be connected to the wiring 55.

The common electrode 19 and the wiring 55 of the flexure 39 are electrically connected to each other through a single contact. This configuration decrease the numbers of wires and wiring locations on the flexure 39, thereby increasing the yield of flexures.

Compared with the piezoelectric actuator of the related art employing a pair of separate piezoelectric elements, the piezoelectric actuator 11 incorporated in the head suspension 31 of the second embodiment employs the single piezoelectric element 13. This configuration reduces the number of piezoelectric parts, improves the efficiency of parts management, and decreases costs.

For example, the related art must handle a pair of separate piezoelectric elements, to involve a risk of mistaking the polarities of the piezoelectric elements. The second embodiment involves no such a risk.

A head suspension according to a third embodiment of the present invention will be explained.

Figure 6:
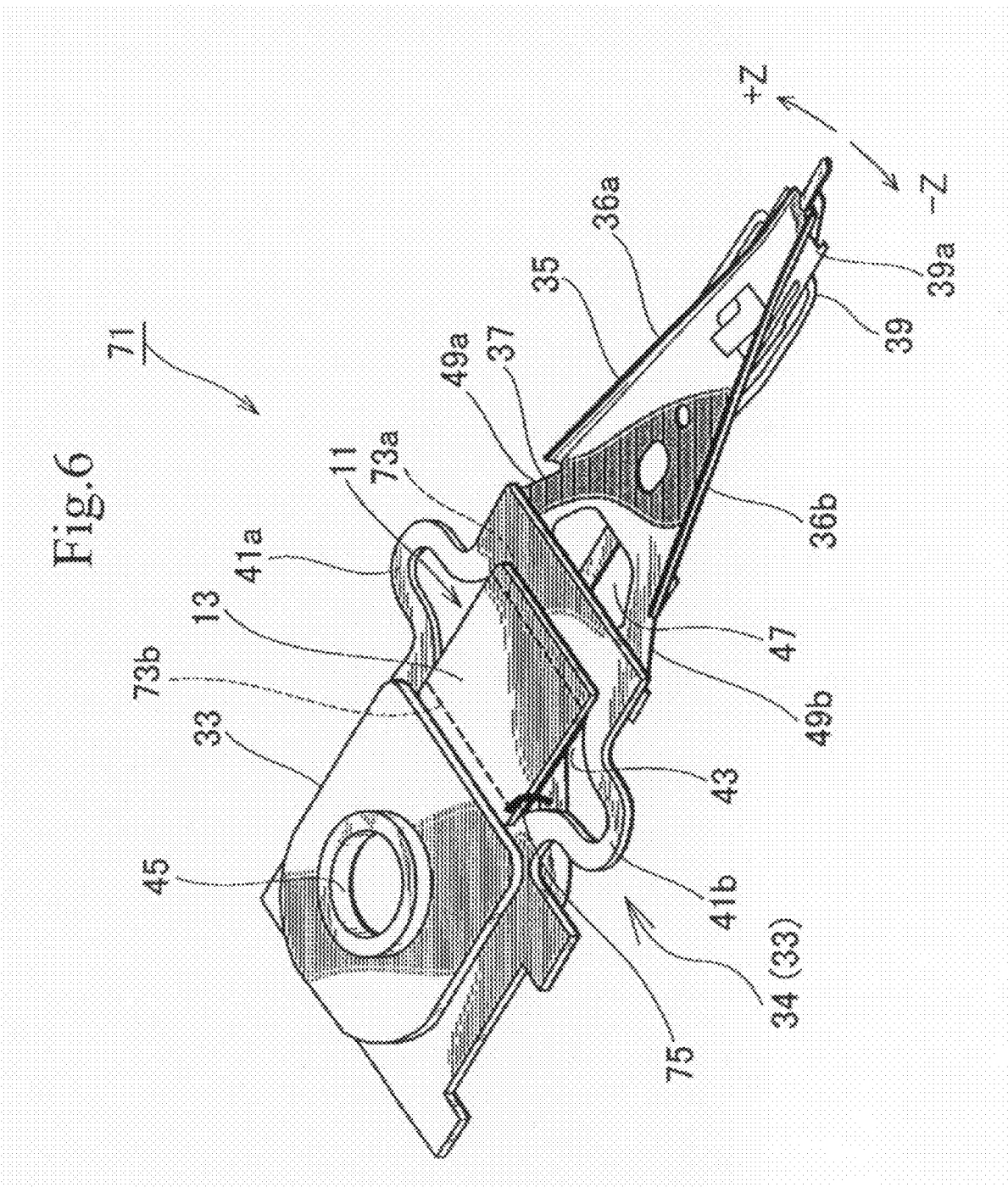
FIG. 6 is a perspective view showing a head suspension according to a third embodiment of the present invention.
Figure 7:
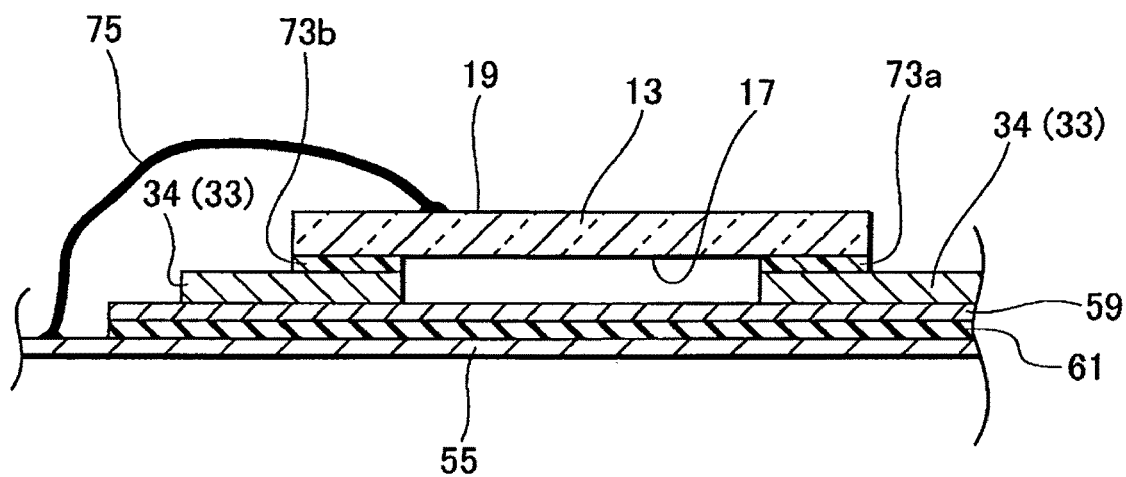
FIG. 7 is a sectional view partly showing a laminated state around an opening of the head suspension of FIG. 6.

FIG. 6 is a perspective view showing the head suspension 71 according to the third embodiment and FIG. 7 is a sectional view partly showing a laminated state around an opening of the head suspension 71. The head suspension 71 is basically the same as the head suspension 31 of the second embodiment, and therefore, like parts are represented with like reference marks.

Unlike the second embodiment that holds the piezoelectric element 13 of the piezoelectric actuator 11 in the opening 43 of the actuator plate 34, the third embodiment arranges and bridges the piezoelectric element 13 between edges of an opening 43 of an actuator plate 34 as shown in FIGS. 6 and 7.

More precisely, conductive adhesive layers 73a and 73b are formed along front and rear edges of the opening 43 of the actuator plate 34 and the piezoelectric element 13 is adhered to the adhesive layers 73a and 73b, to secure electrical connection between the first and second electrodes 15 and 17 of the piezoelectric actuator 11 and the actuator plate 34, as shown in FIGS. 6 and 7.

Contrary to the second embodiment, the head suspension 71 of the third embodiment arranges the piezoelectric element 13 such that the common electrode 19 is on the upper side (opposite to a flexure 39) and the first and second electrodes 15 and 17 on the lower side (facing the flexure 39).

The head suspension 71 employs a bonding wire 75 to electrically connect wiring 55 of the flexure 39 and the common electrode 19 of the piezoelectric element 13 to each other. Instead of the bonding wire 75, other connection means such as a jumper trace may be used. Alternatively, a corresponding part of the wiring 55 of the flexure 39 may be exposed and plated with gold, and the corresponding part may electrically be connected to the common electrode 19 by, for example, ultrasonic joining.

Operation of the head suspension 71 of the third embodiment will be explained. Like the second embodiment, the head suspension 71 displaces a front end of a load beam 35 in a sway direction according to deformation of the piezoelectric actuator 11.

The first and second electrodes 15 and 17 are electrically grounded and a predetermined voltage is applied to the common electrode 19. In this case, the end face 23 of the piezoelectric element 13 under the first electrode 15 contracts and the end face 25 of the piezoelectric element 13 under the second electrode 17 expands. As a result, the piezoelectric element 13 as a whole deforms substantially into a trapezoidal shape as if it turns in a direction +Z (FIG. 6) by a small distance. Namely, the piezoelectric actuator 11 moves the load beam 35 in the sway direction +Z.

Contrary to the above, the common electrode 19 is electrically grounded and a predetermined voltage is applied to the first and second electrodes 15 and 17. In this case, the piezoelectric element 13 deforms in a direction −Z (FIG. 6) by a small distance, to move the load beam 35 in the sway direction −Z.

In this way, the third embodiment provides the same effect as the second embodiment. The head suspension 71 incorporating the piezoelectric actuator 11 is required to secure three systems of electrical connection for the three electrodes, i.e., the first and second electrodes 15 and 17 and common electrode 19 of the piezoelectric element 13. Consequently, the third embodiment simplifies wiring and improves reliability.

Electrical connection between the common electrode 19 and the wiring 55 of the flexure 39 is accomplished by the bonding wire 75 only at a single location. This configuration decreases the numbers of wires and wiring locations on the flexure 39, thereby increasing the yield of flexures.

The piezoelectric actuator 11 incorporated in the head suspension 71 employs the single piezoelectric element 13. This configuration reduces the number of piezoelectric parts, improves the efficiency of parts management, and decreases costs.

The head suspension 71 employs the conductive adhesive layers 73a and 73b to secure electrical connection and mechanical joining strength between the piezoelectric element 13 and the actuator plate 34. This configuration reduces the number of processes and costs.

The present invention is not limited to the embodiments mentioned above. Without departing from the spirit and scope of the present invention stipulated in the specification and claims, the present invention allows a variety of modifications and alterations. It should be understood that head suspensions and piezoelectric actuators based on such modifications and alternations fall in the scope of the present invention.

What is claimed is:

1. A head suspension having a base plate, a load beam connected to the base plate, and a flexure attached to the load beam, the head suspension comprising:
   a piezoelectric actuator arranged between the base plate and the load beam, the piezoelectric actuator having a piezoelectric element configured to deform according to a state of applied voltage and move a front end of the load beam in a sway direction according to the deformation of the piezoelectric, the piezoelectric actuator including:
      first and second piezoelectric parts that are oppositely polarized and deform according to a state of applied voltage;
      a common electrode formed over first surfaces of the first and second piezoelectric parts;
      a first electrode formed on a second surface of the first piezoelectric part; and
      a second electrode formed on a second surface of the second piezoelectric part;
   a wiring formed on the flexure and having a single terminal connected to the common electrode, the terminal being parallel with and facing the common electrode; and
   a conductive layer interposed between the common electrode and the single terminal of the wiring to form an electrical connection therebetween.

2. The head suspension of claim 1, wherein:
   the piezoelectric element substantially has a rectangular shape;
   the first and second electrodes substantially have the same shape and size and are arranged side by side with a gap interposed between them;
   the shape and size of the common electrode are substantially equal to the collective shape and size of the first and second electrodes and gap; and
   the first and second piezoelectric parts are polarized so that their polarities are different from each other by 180 degrees.

3. The head suspension of claim 1, further comprising:
an actuator plate arranged between the base plate and the load beam;
an opening formed through the actuator plate; and
the piezoelectric element being arranged in the opening and attached to the actuator plate.

4. The head suspension of claim 3, wherein:
the common electrode of the piezoelectric element formed on the first surfaces of the first and second piezoelectric parts is in the vicinity of the flexure and the first and second electrodes formed on the second surfaces of the first and second piezoelectric parts are on the far side of the flexure; and
the piezoelectric element and the opening of the actuator plate are electrically isolated from each other with a nonconductive material interposed between them, the common electrode is electrically connected to wiring of the flexure, and the first and second electrodes are electrically connected to the actuator plate.

5. The head suspension of claim 1, further comprising:
an actuator plate arranged between the base plate and the load beam;
an opening formed through the actuator plate; and
the piezoelectric actuator bridged between edges of the opening.

6. The head suspension of claim 5, wherein:
the first and second electrodes formed on the second surfaces of the first and second piezoelectric parts are in the vicinity of the flexure and the common electrode of the piezoelectric element formed on the first surfaces of the first and second piezoelectric parts is on the far side of the flexure;
the first and second electrodes are attached to and electrically connected to the actuator plate; and
the common electrode is electrically connected to wiring of the flexure.

7. The head suspension of claim 1, further comprising:
a resilient connection plate configured to connect the load beam to the base plate; and
a hinge provided for the connection plate, the hinge being configured to bend in thickness directions of the base plate and load beam.

8. The head suspension of claim 1, further comprising:
a flexible part formed on each longitudinal side of the piezoelectric element between the base plate and the load beam, the flexible part outwardly protruding from the longitudinal side.

9. The head suspension of claim 1, wherein:
the common electrode entirely covers the first surfaces of the first and second piezoelectric parts.

10. A piezoelectric actuator for driving an object, comprising:
a piezoelectric element configured to deform according to a state of applied voltage, applied through a wiring formed on the object, and drive the object according to the deformation, the piezoelectric element including:
first and second piezoelectric parts that are oppositely polarized and deform according to a state of applied voltage;
a common electrode formed over first surfaces of the first and second piezoelectric parts;
a first electrode formed on a second surface of the first piezoelectric part;
a second electrode formed on a second surface of the second piezoelectric part,
the common electrode being connectable with the wiring, the wiring being defined so as to comprise only a single terminal positionable so as to be parallel with and facing the common electrode when the piezoelectric actuator is positioned with the object, the common electrode and the single terminal of the wiring, when so relatively positioned, being respectively on either side of a conductive layer interposed between the common electrode and the single terminal so as to form an electrical connection therebetween.

11. The piezoelectric actuator of claim 10, wherein:
the piezoelectric element substantially has a rectangular shape;
the first and second electrodes substantially have the same shape and size and are arranged side by side with a gap interposed between them;
the shape and size of the common electrode are substantially equal to the collective shape and size of the first and second electrodes and gap; and
the first and second piezoelectric parts are polarized so that their polarities are different from each other by 180 degrees.

12. The piezoelectric actuator of claim 10, wherein:
the common electrode entirely covers the first surfaces of the first and second piezoelectric parts.

* * * * *